(12) United States Patent
Hozawa et al.

(10) Patent No.: US 12,471,392 B2
(45) Date of Patent: Nov. 11, 2025

(54) SEMICONDUCTOR DETECTOR AND METHOD OF MANUFACTURING SAME

(71) Applicant: HITACHI HIGH-TECH ANALYSIS CORPORATION, Tokyo (JP)

(72) Inventors: Kazuyuki Hozawa, Tokyo (JP); Takashi Takahama, Tokyo (JP)

(73) Assignee: HITACHI HIGH-TECH ANALYSIS CORPORATION, Tokyo (JP)

( * ) Notice: Subject to any disclaimer, the term of this patent is extended or adjusted under 35 U.S.C. 154(b) by 488 days.

(21) Appl. No.: 18/094,131

(22) Filed: Jan. 6, 2023

(65) Prior Publication Data

US 2023/0290896 A1 Sep. 14, 2023

(30) Foreign Application Priority Data

Mar. 11, 2022 (JP) .................. 2022-037744

(51) Int. Cl.
*H10F 30/295* (2025.01)
*H10F 71/00* (2025.01)
*H10F 77/1223* (2025.01)
*H10F 77/20* (2025.01)

(52) U.S. Cl.
CPC ....... *H10F 30/2955* (2025.01); *H10F 71/121* (2025.01); *H10F 77/1223* (2025.01); *H10F 77/206* (2025.01)

(58) Field of Classification Search
CPC .............. H10F 30/2955; H10F 71/121; H10F 77/1223; H10F 77/206; H10F 30/29
See application file for complete search history.

(56) References Cited

FOREIGN PATENT DOCUMENTS

EP 3907533 A 11/2021

*Primary Examiner* — Matthew L Reames
(74) *Attorney, Agent, or Firm* — Holland & Hart LLP

(57) ABSTRACT

An semiconductor detector includes an n-type semiconductor substrate, a detection electrode formed on a first surface of the semiconductor substrate, a plurality of drift electrodes formed to surround the detection electrode and applied with a voltage causing a potential gradient in which a potential changes toward the detection electrode, a radiation incidence window provided on a second surface of the semiconductor substrate, a P-type semiconductor region formed by adding boron to a surface side on the second surface of the semiconductor substrate through the radiation incidence window, and a depleting electrode causing a reverse bias between the P-type semiconductor region formed on the second surface and an N-type semiconductor region formed in the semiconductor substrate. F is added to the P-type semiconductor region, and a region with the highest concentration of F is located deeper than a region with the highest concentration of B.

4 Claims, 3 Drawing Sheets

SEMICONDUCTOR DETECTOR AND METHOD OF MANUFACTURING SAME

CROSS REFERENCE TO RELATED APPLICATION

The present application claims priority to Japanese Patent Application No. 2022-037744, filed Mar. 11, 2022, the entire contents of which is incorporated herein for all purposes by this reference.

BACKGROUND OF THE INVENTION

1. Field of the Invention

The present invention relates to a semiconductor detector capable of detecting radiation and a method of manufacturing the same.

2. Description of the Related Art

Silicon drift detectors (hereinafter referred to as SDDs) are used as X-ray or e-beam semiconductor detectors applicable to X-ray fluorescence (XRF) spectrometers that detect fluorescent X-rays, energy dispersive X-ray spectroscopy (SEM-EDS) products, and X-ray detectors.

As to an SDD, a P-type semiconductor region is provided on a first surface (window surface side) of a highly resistive n-type semiconductor substrate through boron (B) implantation to form a pn junction.

Conventionally, to adjust the operating voltage (hereinafter referred to as "threshold voltage" or "$V_{th}$") of an SDD, phosphorus (P) or arsenic (As) as a counter was implanted into a boron (B)-doped region. Specifically, the Vth was adjusted by changing the implantation conditions such as implantation dose and implantation depth (refer to Patent Literature 1).

LITERATURE OF RELATED ART

Patent Literature

[Patent Literature] European Patent No. 3907533

SUMMARY OF THE INVENTION

The conventional technique described above has problems described below.

Since the EDS characteristics of an SDD are significantly influenced by the magnitude of a dark current, it is required to increase $V_{th}$ without increasing the dark current.

As to existing semiconductor detectors, $V_{th}$ adjustment thereof can be achieved by additionally implanting P or As. However, this additional implantation has a problem of increasing a dark current. This is likely because, as shown in FIG. 3, additional implantation for P as a counter increases crystal defects and steepens a pn junction.

In other words, referring to FIG. 3, in the case of "(2) with counter doping A" in which P is additionally implanted as a counter, as compared with a B profile corresponding to the case of "(1) without counter doping", the effective carriers are dramatically reduced and thus a shallow pn junction can be formed. However, there are problems in that the pn junction is steep and crystal defects occur, resulting in an increase in dark current.

In particular, when the dose of P as a counter is increased to raise the $V_{th}$, as indicated by "(3) with counter doping B in FIG. 3", more crystal defects occur, which leads to a further increase in dark current.

In addition, the $V_{th}$ adjustment of an SDD can also be achieved by changing the resistance of a substrate, the design of an SDD element, or the like. However, in this case, it is not easy to change such parameters. Even though the parameters can be changed, there is a risk that other characteristics (dark current, EDS characteristics, and so on) will also change.

The present invention has been made in view of the aforementioned problems, and an objective of the present invention is to provide a semiconductor detector constructed such that an operating voltage thereof is raised without increasing a dark current, and to a method of manufacturing the same.

The present invention employs a construction described below to solve the aforementioned problems. That is, a semiconductor detector according to a first invention includes: an n-type semiconductor substrate; a detection electrode formed on a first surface of the semiconductor substrate and configured to collect charges generated due to incidence of radiation; a plurality of drift electrodes formed surrounding the detection electrode and applied with a voltage causing a potential gradient in which a potential changes toward the detection electrode so that the charges move toward the detection electrode; an incidence window for radiation, provided on a second surface of the semiconductor substrate; a P-type semiconductor region formed by adding boron to a surface side of the second surface within the incidence window; and a depleting electrode formed on the second surface and configured to apply a reverse bias between the P-type semiconductor region formed on the second surface and an N-type semiconductor region of the semiconductor substrate, in which fluorine is further added to the P-type semiconductor region, and a region with the highest concentration of fluorine is located closer to the surface side of the second surface than a region with the highest concentration of boron.

In the semiconductor detector, since fluorine is additionally added to the P-type semiconductor region, and the region with the highest concentration of fluorine is closer to the surface side of the second surface than the region with the highest concentration of boron, it is possible to adjust a threshold voltage ($V_{th}$) while suppressing influence on a dark current. In other words, since fluorine (F) added as a counter offsets the effect of boron (B) serving as a carrier in the P-type semiconductor region, it is possible to change the position of a pn junction and inhibit the spreading of a depletion layer, thereby increasing the $V_{th}$. Since F becomes negative charges (i.e., negatively charged) in the semiconductor substrate and behaves like n-type carriers, the $V_{th}$ rises. In addition, the $V_{th}$ can be adjusted by controlling the implantation dose, implantation depth, and so on of F.

In particular, since the region with the highest concentration of fluorine is positioned to be closer to the surface side of the second surface than the region with the highest concentration of boron, the high-concentration F added to the surface makes the pn junction shallower than the case where only B is added. Thus, the $V_{th}$ can be adjusted. In addition, since F is added to the surface in a high concentration and is present in a low concentration in a relatively deep region, the number of crystal defects caused by fluorine implantation is reduced, and thus an increase in dark current is suppressed.

A semiconductor detector according to a second invention, in addition to the first invention, includes a first concentration-decreasing portion in which the concentration of fluorine decreases along a depth direction from the surface of the second surface and a second concentration-decreasing portion which is located in a deeper position than the first concentration-decreasing portion and in which the concentration of fluorine decreases along the depth direction and is lower than that of the first concentration-decreasing portion. Since the concentration of the fluorine decreases more gently in the second concentration-decreasing portion than in the first concentration-decreasing portion, and the fluorine is more deeply dispersed than the boron, the distribution of an effective carrier is not steep, and a pn junction is not steep. Therefore, it is possible to suppress an increase in dark current.

A semiconductor detector manufacturing method according to a third invention is a method of manufacturing the semiconductor detector of the first or second invention. The method includes: a P-type semiconductor region formation step in which boron is added to a surface of an n-type semiconductor substrate to form a P-type semiconductor region. The P-type semiconductor region formation step includes a fluorine addition step in which fluorine is further added to a surface of the semiconductor substrate. The fluorine addition step includes a fluorine implantation step of implanting fluorine and a heat treatment step of performing heat treatment after the fluorine implantation step.

That is, since the semiconductor detector manufacturing method has the heat treatment step in which heat treatment is performed after the fluorine implantation step, the added fluorine diffuses and moves toward the surface due to the heat treatment, so that a highly concentrated fluorine distribution is formed near the surface. Due to a deep boron concentration distribution and a shallow fluorine concentration distribution, the depth of a pn junction changes so that the pn junction is positioned to be shallow.

In a semiconductor detector manufacturing method according to a fourth invention, regarding the heat treatment step in the third invention, the heat treatment is performed at a temperature of 800° C. or lower.

That is, in the semiconductor detector manufacturing method, since the heat treatment step is a heat treatment performed at 800° C. or lower, the diffusion and activation of F can be sufficiently achieved by the heat treatment of 800° or lower. When the heat treatment temperature exceeds 800° C., F will excessively diffuse, and thus the effect of F cannot be obtained.

According to the present invention, the effects described below can be obtained.

That is, in the semiconductor detector and the semiconductor detector manufacturing method according to the present inventions, since fluorine is additionally added to a P-type semiconductor region, and a region with the highest concentration of fluorine is closer to the surface side of a second surface than a region with the highest concentration of boron, it is possible to adjust a threshold voltage ($V_{th}$) while suppressing influence on a dark current, according to the dost and depth of F implantation.

Accordingly, in the semiconductor detector and the semiconductor detector manufacturing method according to the present inventions, it is possible to adjust the $V_{th}$ while suppressing an increase in dark current. Due to this, it is possible to obtain an SDD having improved EDS characteristics.

DESCRIPTION OF THE PREFERRED EMBODIMENTS

Figure 1:
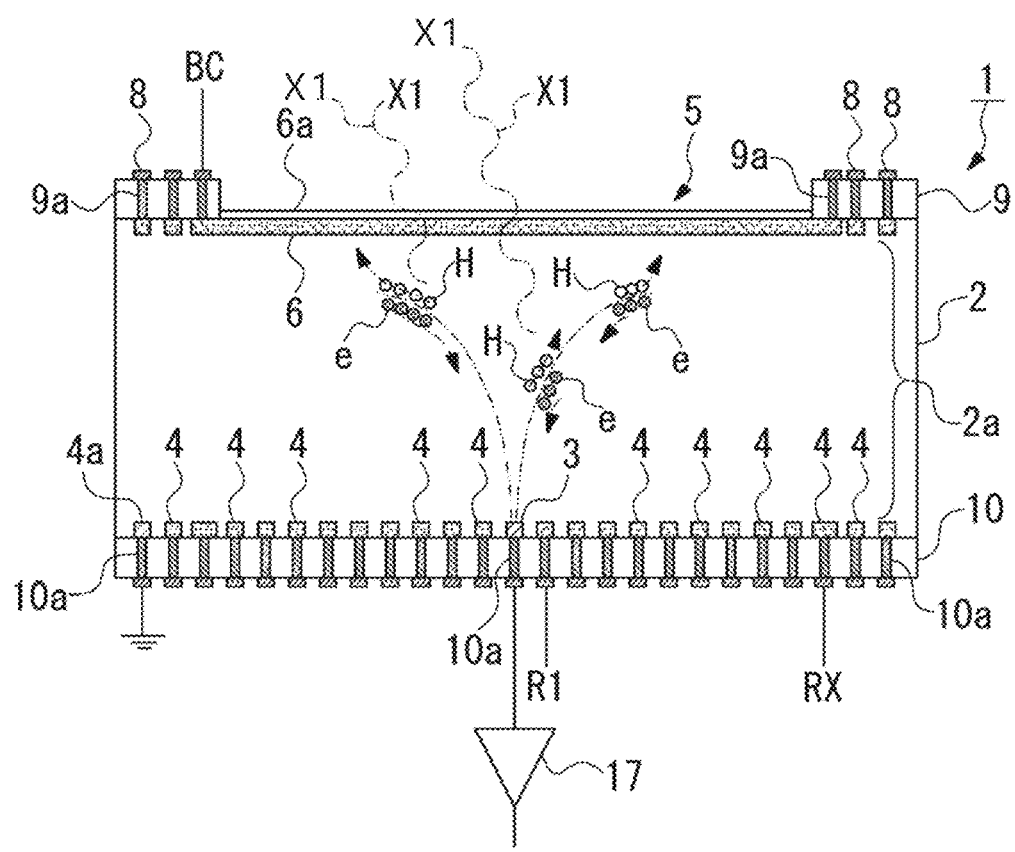
FIG. 1 is a cross-sectional view illustrating a semiconductor detector in connection with embodiments of a semiconductor detector and a manufacturing method thereof according to the present invention.
Figure 2:
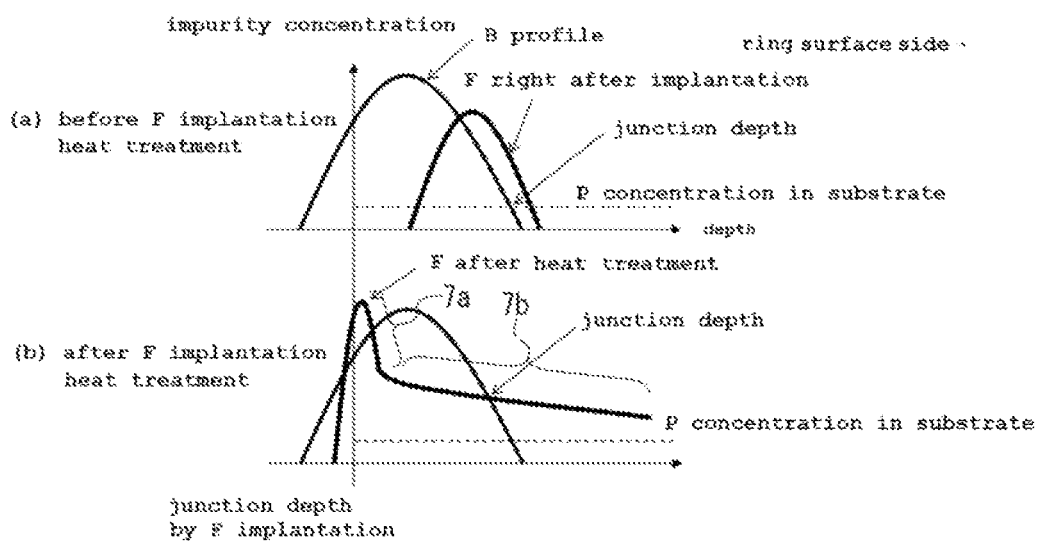
FIG. 2 is a graph showing a B concentration distribution, a F concentration distribution, and a pn junction depth measured by secondary ion mass spectrometry (SIMS) and spreading resistance analysis (SRA) before F implantation heat treatment (a) and after F implantation heat treatment (b).
Figure 3:
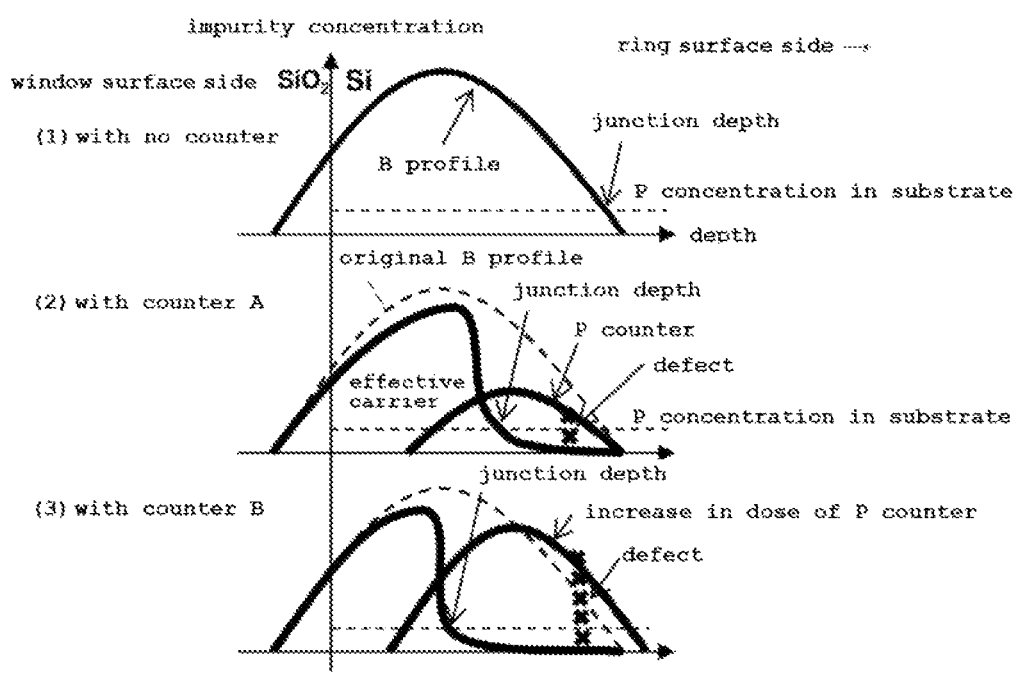
FIG. 3 is a graph showing a B concentration distribution, an effective carrier distribution, a counter concentration distribution, and a pn junction depth measured by SIMS analysis, and SRA analysis for each of the cases of "(1) with no counter", "(2) with counter A", and "(3) with counter B" in connection with conventional arts of a semiconductor detector and a manufacturing method thereof related to the present invention.

Hereinafter, embodiments of a semiconductor detector and a manufacturing method thereof according to the present invention will be described with reference to FIGS. 1 and 2.

A semiconductor detector 1 of the present embodiment is a silicon drift detector (SDD). As illustrated in FIG. 1, the semiconductor detector 1 includes: an n-type semiconductor substrate 2; a detection electrode 3 formed on a first surface of the semiconductor substrate 2 and configured to collect charges generated due to incidence of radiation X1; a plurality of drift electrodes 4 formed surrounding the detection electrode 3 and applied with a voltage causing a potential gradient in which a potential changes toward the detection electrode 3 so that the charges move toward the detection electrode 3; an incidence widow 5 receiving radiation X1 and provided on a second surface of the semiconductor substrate 2; a P-type semiconductor region 6 formed by adding boron (B) to a surface side of the second surface through the incidence window 5; and a depleting electrode BC configured to apply a reverse bias between the P-type semiconductor region 6 formed on the second surface and an N-type semiconductor region 2a of the semiconductor substrate 2.

In the P-type semiconductor region 6, fluorine is additionally added. As illustrated in FIG. 2, a region with the highest concentration of F is closer to the surface side of the second surface than a region with the highest concentration of B. That is, the peak of an F concentration profile is located closer to the surface side of the second surface than the peak of a B concentration profile. In addition, in the present embodiment, the peak of the F concentration profile is located on or near the surface of the second surface.

For the addition of F, a compound containing F, for example $BF_2$, may be used as a dopant.

In addition, the semiconductor detector may further include: a first concentration-decreasing portion 7a in which the concentration of F decreases in along a depth distance from the surface of the second surface; and a second concentration-decreasing portion 7b in which the concentration of F decreases along the depth direction, the second concentration-decreasing portion 7b being located deeper and having a lower F concentration than the first concentration-decreasing portion 7a.

In the second concentration-decreasing portion 7b, the concentration of F decreases more gently than that in the first concentration-decreasing portion 7a, and F is dispersed more deeply than B.

In addition, the concentration-decreasing portion 7b extends from the P-type semiconductor region 6 to the N-type semiconductor region 2a of the semiconductor substrate 2.

The semiconductor substrate 2 is an Si substrate doped with an n-type impurity and is a highly resistive substrate with a resistance of 5 kΩ or more.

The detection electrode 3 is a signal output electrode made of an n⁺-type semiconductor and functions as an anode electrode.

The detection electrode 3 is electrically connected to an amplifier 17.

The amplifier 17 includes a field effect transistor or a CMOS amplifier, in which a gate electrode thereof is connected to the detection electrode 3.

The P-type semiconductor region 6 is P⁺Si to which both B and F are added by implantation, and a pn junction is formed between the P-type semiconductor region 6 and the N-type semiconductor region 2a of the semiconductor substrate 2.

The P-type semiconductor region 6 serves as a cathode, and the detection electrode 3 serves as an anode.

In addition, an oxide film ($SiO_2$) 6a is formed on the surface of the P-type semiconductor region 6.

The depleting electrode BC is a back contact connected to the P-type semiconductor region 6. By the adjustment of the voltage applied to the depleting electrode BC, a reverse bias voltage can be applied to the pn junction, and a depletion layer spreads out from the pn junction. Thus, the semiconductor substrate 2 becomes depleted.

In addition, a plurality of ring-shaped protective electrodes 8 having a floating potential are formed outside the depleting electrode BC to prevent insulation breakdown between the edge of the semiconductor substrate 2 and the P-type semiconductor region 6.

Each of the plurality of drift electrodes 4 is a concentric ring electrode with respect to the detection electrode 3 and is spaced from each other.

Each of the plurality of drift electrodes 4 includes an inner electrode R1 formed at an inner periphery and an outer electrode RX formed at an outer periphery. In addition, different voltages are applied to the inner electrode R1 and the outer electrode RX, so that a drift electric field is formed on the semiconductor substrate 2 having a depletion layer.

That is, a voltage is applied such that the potential of the innermost drift electrode 4 is highest and the potential of the outermost drift electrode 4 is lowest.

In addition, the outermost electrode 4a is a grounding electrode.

The first surface is a so-called ring surface on which the plurality of ring-shaped drift electrodes 4 is formed.

Furthermore, the second surface is a so-called window surface on which the incidence window 5 is provided.

A second surface side insulating film 9 made of an oxide film ($SiO_2$) is a guide ring and is positioned at the outer periphery of the incidence window 5.

The protective electrode 8 and the depleting electrode BC are respectively connected to the semiconductor substrate 2 or the P-type semiconductor region 6 via a metal electrode 9a extending through the second surface side insulating film 9.

The first surface is provided with a first surface side insulating film 10 made of an oxide film ($SiO_2$).

The detection electrode 3 and the plurality of drift electrodes 4 are each connected to the N-type semiconductor region 2a of the semiconductor substrate 2 via a metal electrode 10a extending through the first surface side insulating film 10.

The semiconductor detector 1 of the present embodiment operates in a manner described below.

First, when radiation X1, such as X-rays, photons, electron beams, or other charged particle beams, enters the semiconductor substrate 2 through the incident window 5, charges (holes H and electrons e) corresponding to the energy of the radiation X1 absorbed by the semiconductor substrate 2 are generated in the semiconductor substrate 2.

These charges are moved by an electric field in the semiconductor substrate 2, and the electrons e are introduced into and collected by the detection electrode 3 formed at the center. The electrons e collected by the detection electrode 3 are output via an amplifier 17 as an electrical signal.

Next, a method of manufacturing the semiconductor detector 1, according to the present embodiment, will be described below.

The method of manufacturing the semiconductor detector 1, according to the present embodiment, includes a P-type semiconductor region formation step in which boron (B) is added to the surface of an n-type semiconductor substrate 2 so that a P-type semiconductor region 6 can be formed in the n-type semiconductor substrate 2.

The P-type semiconductor region formation step includes a fluorine addition step in which fluorine (F) is added to the surface of the semiconductor substrate 2.

The fluorine addition step includes a fluorine implantation step of implanting F and a heat treatment step of performing heat treatment after the fluorine implantation step. The implantation conditions in the fluorine implantation step are appropriately set according to the concentration of the P-type semiconductor region 6, the depth of a pn junction, the thickness of an oxide film 6a, and so on.

The heat treatment step is preferably a furnace body heat treatment performed at a temperature of 800° C. or lower.

When rapid thermal anneal (RTA) is used, it is allowed that the heat treatment is performed at a temperature higher than 800° C. For example, the heat treatment can be performed at 850° C. for one minute.

In addition, the diffusion of F is adjusted by increasing the heat treatment time when the heat treatment temperature is relatively low and by shortening the heat treatment time when the heat treatment temperature is relatively high. The $V_{th}$ can also be adjusted by changing the heat treatment conditions.

Specifically, the furnace body heat treatment is carried out, for example, at 800° C. for several minutes, at 750° C. for 60 minutes, at 650° C. for 4 hours, at 600° C. for 8 hours, or at 500° C. for 12 to 16 hours.

After the heat treatment, hydrogen annealing is preferably carried out in a temperature range of 400° C. to 450° C. for H-termination purposes. The heat treatment step is preferably performed at a temperature of 500° C. or higher. That is, the heat treatment conditions are preferably set in a temperature range of 500° C. 800° C. and a duration of 1 minute to 12 hours.

In the semiconductor detector 1 of the present embodiment, fluorine is further added to the P-type semiconductor region 6, and the region with the highest concentration of fluorine is located to be closer to the surface side of the second surface than the region with the highest concentration of boron. Therefore, it is possible to adjust a threshold voltage ($V_{th}$) while suppressing influence on a dark current. That is, since the fluorine (F) added as a counter offsets the effect of boron (B) serving as a carrier in the P-type semiconductor region, it is possible to change the position of a pn junction and inhibit the spreading of a depletion layer, thereby raising the $V_{th}$. Since fluorine (F) becomes negative charges (i.e., negatively charged) in the semiconductor substrate and behaves like n-type carriers, the $V_{th}$ rises. In addition, the $V_{th}$ can be adjusted by controlling the dose and depth for F implantation.

In particular, since the region with the highest concentration of fluorine is closer to the surface side of the second surface than the region with the highest concentration of boron, the highly concentrated fluorine (F) present in the surface region makes the pn junction shallower than that of the case where only boron (B) is added. Thus, the $V_{th}$ can be adjusted. In addition, since fluorine (F) is added in a high concentration in the surface region and is present in a low concentration in a relatively deep region, the number of crystal defects caused by fluorine implantation is reduced, and thus an increase in dark current is suppressed.

In addition, the second concentration-decreasing 7b is formed such that the concentration of fluorine more gently decreases than that in the first concentration-decreasing portion 7a, and the fluorine is more deeply dispersed than the boron, the effective carrier distribution is not steep, the pn junction is not steep, and an increase in dark current can be suppressed.

That is, since the method of manufacturing the semiconductor detector 1 includes the heat treatment step performed after the fluorine implantation step, the added fluorine diffuses and moves toward the surface side of the second surface due to the heat treatment, resulting in a highly concentrated fluorine distribution positioned near the surface. In addition, a deep boron concentration distribution and a shallow fluorine concentration distribution makes a pn junction shallower.

Furthermore, because the heat treatment step is a heat treatment performed at a temperature of 800° C. or lower, the diffusion and activation of F can be sufficiently performed by a low-temperature heat treatment performed at 800° C. or lower.

[Example]

Regarding the semiconductor detector of the present invention, a plurality of examples was manufactured with changes in implantation conditions for F on the basis of the embodiment described above. For the examples (A to D in Table 1) of the present invention, a dark current and a threshold voltage ($V_{th}$) were measured, and the results are shown in Table 1.

Regarding the implantation conditions for F, an implantation dose of F was in a range of $1\times10^{12}/cm^2$ to $1\times10^{15}/cm^2$, and an energy intensity for F implantation was in a range of 2 KeV to KeV.

In addition, for each of the examples, heat treatment was performed at 750° C. for 60 minutes.

Comparative Example 1 was manufactured under conditions in which F implantation was not performed and heat treatment was not performed (Ref in Table 1).

Comparative Example 2 was manufactured under conditions in which the energy intensity for F implantation was increased so that F was deeply implanted (E in Table 1). Thus, a region with the highest concentration of F was positioned to be deeper than a region with the highest concentration of B on a first surface side of a substrate.

The same measurement as in the examples of the present invention was performed for Comparative Examples 1 and 2.

TABLE 1

| | F implantation dose (/cm²) | F implantation energy (keV) | Dark current (pA) | Threshold voltage (V) |
|---|---|---|---|---|
| Ref | — | — | 20 | 75 |
| A | 0.5E14 | 10 | 20 | 80 |
| B | 1.0E14 | 10 | 21 | 96 |
| C | 3E14 | 10 | 33 | 112 |
| D | 1E14 | 5 | 20 | 76 |
| E | 1E14 | 30 | 200 | 310 |

As can be seen from the results, compared with Comparative Example 1 (Ref in Table 1) manufactured without performing F implantation, each of Examples A to D of the present invention showed that the dark current remained almost unchanged but the threshold voltage $V_{th}$ increased.

In the case of Comparative Example 2 (E in Table 1), since F implantation was performed with an increased implantation energy intensity, the threshold voltage significantly increased, and the dark current also increased.

It should be noted that the technical scope of the present invention is not limited to the above-described embodiments and examples, and various changes can be within a scope that does not depart from the spirit of the present invention.

What is claimed is:

1. A semiconductor detector comprising:
   an n-type semiconductor substrate;
   a detection electrode formed on a first surface of the n-type semiconductor substrate and configured to collect charges generated by incidence of radiation;
   a plurality of drift electrodes formed surrounding the detection electrode and applied with a voltage causing a potential gradient in which a potential changes toward the detection electrode so that the charges move toward the detection electrode; and
   a radiation incidence window provided on a second surface of the n-type semiconductor substrate;
   a P-type semiconductor region formed by adding boron to a surface side of the second surface through the radiation incidence window; and
   a depleting electrode causing a reverse bias between the P-type semiconductor region formed on the second surface and an N-type semiconductor region formed in the n-type semiconductor substrate,
   wherein fluorine is additionally added to the P-type semiconductor region, and
   wherein a region with the highest concentration of fluorine is positioned more closely to the surface side of the second surface than a region with the highest concentration of boron.

2. The semiconductor detector of claim 1, wherein the semiconductor detector comprises a first concentration-decreasing portion in which the concentration of fluorine decreases along a depth direction from the surface of the second surface and a second concentration-decreasing portion in which the concentration of fluorine decreases along the depth direction from the first concentration-decreasing portion, the second concentration-decreasing portion being located deeper than the first concentration-decreasing portion,
   the second concentration-decreasing portion is configured such that the concentration of the fluorine decreases more gently than that of the first concentration-decreasing portion, and a distribution of the fluorine is located deeper than a distribution of the boron.

3. A method of manufacturing the semiconductor detector according to claim 1 or claim 2, the method comprising:
- a P-type semiconductor region formation step in which boron is added to a surface of an n-type semiconductor substrate so that a P-type semiconductor region is formed in the n-type semiconductor substrate,
- wherein the P-type semiconductor region formation step comprises a fluorine addition step in which fluorine is added to the surface of the n-type semiconductor substrate, and
- the fluorine addition step comprises a fluorine implantation step of implanting fluorine and a heat treatment step of performing heat treatment after the fluorine implantation step.

4. The method of claim 3, wherein, in the heat treatment step, the heat treatment is performed at a temperature of 800° or below.

* * * * *